United States Patent [19]

Visel et al.

[11] Patent Number: 5,220,280

[45] Date of Patent: Jun. 15, 1993

[54] METHOD AND AN APPARATUS FOR TESTING THE ASSEMBLY OF A PLURALITY OF ELECTRICAL COMPONENTS ON A SUBSTRATE

[75] Inventors: Thomas A. Visel; John F. Stockton, both of Phoenix, Ariz.

[73] Assignee: VLSI Technology, Inc., San Jose, Calif.

[21] Appl. No.: 350,489

[22] Filed: May 11, 1989

[51] Int. Cl.$^5$ .......................... G01R 1/02; G01R 1/04
[52] U.S. Cl. .............. 324/158 R; 324/158 P; 324/158 F; 437/8
[58] Field of Search ............... 437/8; 371/23, 16.2; 324/158 P, 158 F, 158 R; 29/593, 846

[56] References Cited

U.S. PATENT DOCUMENTS

| | | | |
|---|---|---|---|
| 3,657,527 | 4/1972 | Kassabgi et al. | 371/29.1 |
| 4,038,648 | 7/1977 | Chesley | 364/900 |
| 4,139,818 | 2/1979 | Schneider | 324/73 R |
| 4,484,329 | 11/1984 | Slamka et al. | 371/22.6 |
| 4,538,104 | 8/1985 | Douglas et al. | 324/158 F |
| 4,639,664 | 1/1987 | Chiu et al. | 324/73 AT |
| 4,642,560 | 2/1987 | Morille et al. | 324/158 F |
| 4,711,024 | 12/1987 | Russell | 29/832 |
| 4,758,780 | 7/1988 | Coon et al. | 324/158 F |
| 4,835,469 | 5/1989 | Jones et al. | 324/158 F |
| 4,853,626 | 8/1989 | Resler | 324/158 R |

FOREIGN PATENT DOCUMENTS

| | | | |
|---|---|---|---|
| 2057948 | 6/1971 | Fed. Rep. of Germany | 324/158 F |
| 0023869 | 2/1982 | Japan | 324/158 F |
| 0127560 | 5/1988 | Japan | 324/158 F |
| 2156532 | 10/1985 | United Kingdom | 324/158 F |
| 2157507 | 10/1985 | United Kingdom | 324/158 F |

*Primary Examiner*—Kenneth Wieder
*Assistant Examiner*—William J. Burns
*Attorney, Agent, or Firm*—Limbach, Limbach & Sutton

[57] ABSTRACT

In the present invention a method of testing a partially completely assembled module with integrated circuit dies mounted thereon is disclosed. The partially-completely assembled module has one or more first locations with integrated circuit dies mounted thereon and one or more second locations with integrated circuit dies to be mounted thereon and one or more electrical paths electrically connecting the first and second locations. A supplementary module with one or more electrical components assembled in the second locations and with one or more electrical components to be assembled in the first locations and with electrically identical electrical paths connecting the first and second locations as the testing module is also provided. The testing module and the supplementary module are mated together by electrically connecting the first and second locations of the testing module to the first and second locations of the supplementary module, respectively. The resultant combined module is tested as if it were a completely assembled module.

9 Claims, 2 Drawing Sheets

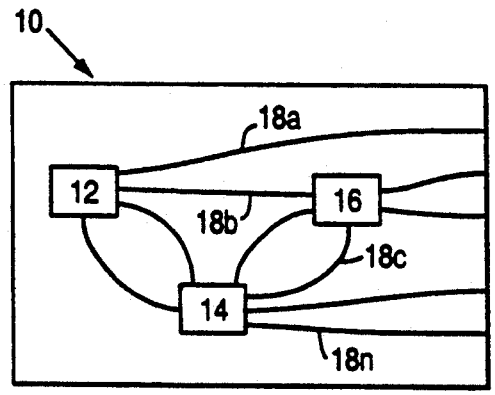
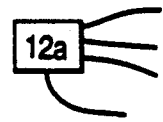
FIG. 1
FIG. 2
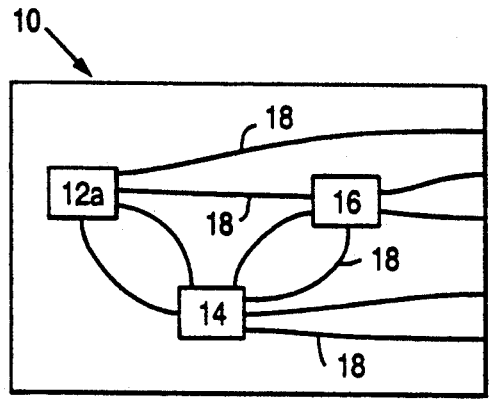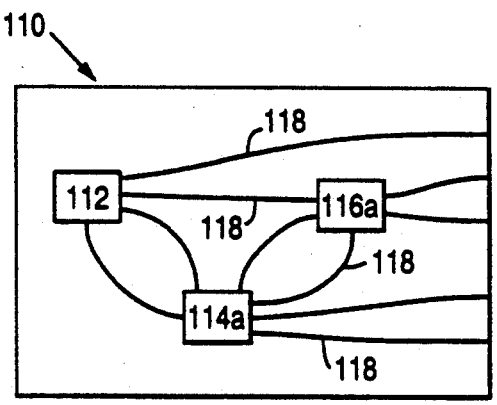
FIG. 3
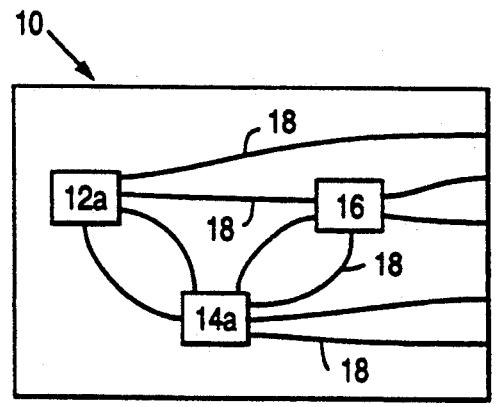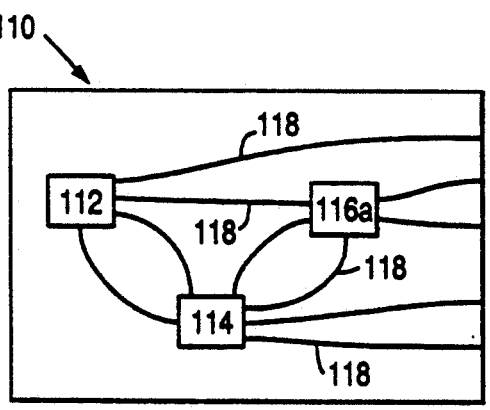
FIG. 4

METHOD AND AN APPARATUS FOR TESTING THE ASSEMBLY OF A PLURALITY OF ELECTRICAL COMPONENTS ON A SUBSTRATE

TECHNICAL FIELD

The present invention relates to a method and an apparatus for testing each and every electrical component of an electrical apparatus which has a plurality of sites having one or more electrical paths interconnecting those sites and electrical components at those sites, electrically connected to the electrical paths. In particular, the present invention relates to a method and an apparatus for testing each and every electrical component of the electrical apparatus as each of the electrical components is assembled and electrically connected to the electrical paths in order to detect failures in the assembly process.

BACKGROUND OF THE INVENTION

Methods for testing electronic components are well known in art. See, for example, U.S. Pat. Nos. 4,711,024; 4,038,648; 4,139,818; 3,657,527; and 4,639,664.

In particular, in U.S. Pat. Nos., 4,711,024 and 4,038,648, all of the electrical components are mounted and then subsequently each one of those electrical components is tested. Further, in U.S. Pat. No. 4,711,024, each of the electrical components that is mounted must have a quiescence and a non-quiescence state, thereby limiting the type of electrical components that can be tested by that method.

SUMMARY OF THE INVENTION

The present invention relates to a method of testing a partially completely assembled electrical apparatus (hereinafter called "testing apparatus"). The testing apparatus has one or more first locations, one or more second locations, and one or more electrical paths electrically connecting the first and second locations. A first electrical component is assembled in each of the first locations and is electrically connected to the electrical paths. A second electrical component is to be assembled in each of the second locations and is to be electrically connected to the electrical paths. The method of the present invention comprises the steps of providing a supplementary electrical apparatus which is substantially identical to the testing apparatus. The supplementary electrical apparatus has one or more first locations, one or more second locations, and one or more electrical paths electrically connecting the first and second locations, electrically identical to the electrical paths of the testing apparatus. The supplementary electrical apparatus further comprises one or more second electrical components, electrically identical to the electrical components to be assembled of the testing apparatus. Each of the second electrical components of the supplementary electrical apparatus is electrically connected to the electrical paths at each of the second locations. The first and second locations of the testing apparatus and the supplementary electrical apparatus are electrically connected together to form a combined apparatus. The combined apparatus is electrically tested as if it were a completely assembled and electrically connected electrical apparatus.

The present invention also comprises the apparatus described heretofore, the means for electrically connecting the first and second locations of the testing apparatus to the apparatus to form the combined apparatus, and the means for electrically testing the combined apparatus as if it were a completely assembled electrical apparatus.

BRIEF DESCRIPTION OF THE DRAWINGS

FIG. 1 is a schematic plan view of a module used in the method of the present invention, having a plurality of locations for the assembly of electrical components thereon with one or more electrical paths interconnecting the locations.

FIG. 2 is a schematic view of an integrated circuit die, one type of electrical component which is used in the module shown in FIG. 1 in the method of the present invention.

FIG. 3 are schematic views of the first step in the method of testing a partially completely assembled electrical apparatus (testing apparatus) and a supplementary electrical apparatus to test the testing apparatus.

FIG. 4 is a schematic plan view of the testing apparatus with a second electrical component assembled thereon.

DETAILED DESCRIPTION OF THE DRAWINGS

Figure 5:
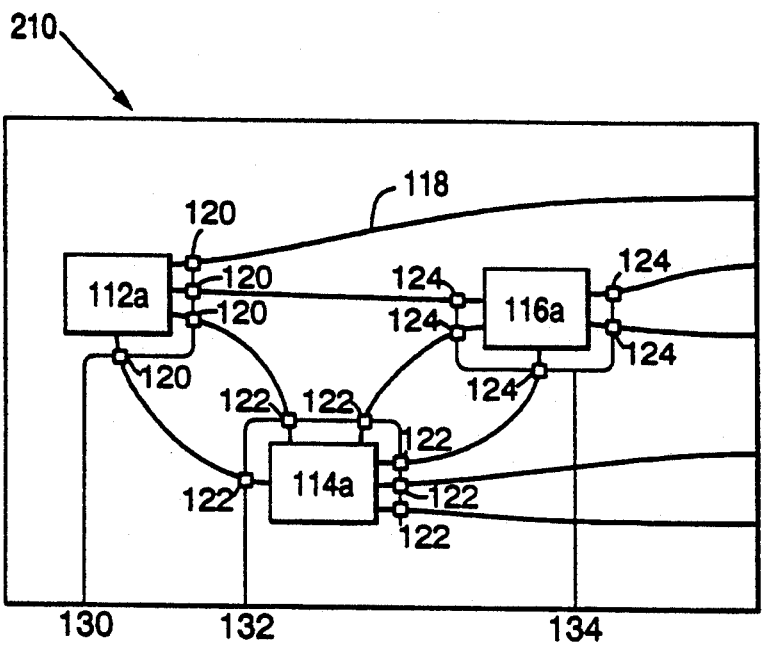
FIG. 5 is a schematic plan view of another embodiment of a supplementary electrical apparatus useful in the method of the present invention.

Referring to FIG. 1 there is shown a module 10 having a plurality of locations 12, 14, and 16 with a plurality of electrical paths 18(a . . . n) electrically interconnecting the plurality of locations 12, 14 and 16. A typical module 10 is a so-called chip-on-board module. The chip-on-board module 10 is used for the assembling or mounting of electrical components, such as an integrated circuit die (unpackaged integrated circuits) for assembling and mounting in the plurality of locations 12, 14, and 16. Of course, it should be understood, that the module 10 can also be a conventional printed circuit board or any other type of substrate useful for mounting of electrical components.

Referring to FIG. 2 there is shown a schematic view of an integrated circuit die 12a. Typically, the integrated circuit die 12a is physically placed at the location 12 and a well-known wire bonding technique is used to wire bond, i.e., electrically connect various parts of the integrated circuit die 12a to the various electrical paths 18(a . . . n). The method of the present invention is useful for testing the module 10 as each integrated circuit die (such as 12a) is mounted in their respective locations (such as 12) on the module 10, and the electrical wires are connected from the integrated circuit die to the electrical paths 18. The method of the present invention will be described with regard to the module 10 having three locations 12, 14, and 16 thereon. Clearly, the number of locations is not limited to three.

Referring to FIG. 3 there is shown the first step in the method of the present invention. In the first step, the module 10 has one integrated circuit die (12a) mounted at location 12 and with electrical wires connecting the integrated circuit die 12a to the electrical paths 18. The module 10 will be referred to as the testing module 10. FIG. 3 also shows a supplementary module 110. The supplementary module 110 is substantially identical to the testing module 10. The supplementary module 110 has three locations: 112, 114, and 116. The supplementary module 110 also has a plurality of electrical paths 118 electrically identical to the electrical path 18 of the testing module 10, interconnecting the locations 112, 114, and 116. In FIG. 3, the supplementary module 110 is shown as having integrated circuit dies 114a mounted at location 114 and electrically connected to the electrical paths 118. The supplementary module 110 also has the integrated circuit die 116a mounted at location 116 and electrically connected to the electrical paths 118.

The plurality of locations 12, 14, and 16 of the testing module 10 are electrically connected to the plurality of locations 112, 114, and 116 of the supplementary module 110. (This will be described in greater detail hereinafter.) The resultant combined module, comprising of the testing module 10 and the supplementary module 110 with the respective locations electrically connected is then tested by a testing apparatus (not shown) as if the testing apparatus 10 were completely and fully assembled with integrated circuit dies 12a, 14a, and 16a mounted in the respective locations of 12, 14, and 16 and electrically connected to the electrical paths 18.

If the result of the test shows that the combined apparatus is defective, and since the apparatus 110 is pre-tested and is known to be in working order, then the defect stems from either the integrated circuit die 12a or the mounting and assembly thereof. In that event, the integrated circuit die 12a is sheared off or is otherwise removed from the testing module 10. Alternatively, the wire bonds electrically connecting the integrated circuit die 12a to the electrical paths 18 are cut. In either case, another integrated circuit die 12a is mounted at the location 12 and wire bonded to the electrical paths 18.

If the result of the test on the combined apparatus is positive, i.e., there is no defect, then the method of the present invention proceeds to the second step shown in FIG. 4.

In FIG. 4, a second integrated circuit die 14a is placed at the location 14 and wire bonds are used to electrically connect the integrated circuit die 14a to the electrical paths 18. The supplementary module 110 to the testing module 10 will comprise of only a single integrated circuit die 116a mounted at location 116 with electrical wires electrically wire bonding the integrated circuit die 116a to the electrical paths 118. The supplementary apparatus will not have any integrated circuit die mounted in location 112 or 114. Once again, the testing module 10 and the supplementary module 110 are electrically connected together with the locations 12, 14, and 16 of the testing module 10 being electrically connected to the locations 112, 114, and 116 of the complementary module 110. The combined module is then tested by a tester as if the testing module 10 were completely and fully assembled.

If the result of the test is defective, then corrective measure is taken with respect to the integrated circuit die 14a and/or its mounting thereof on the testing module 10. If the result of the test is positive, i.e., no defects, then the testing module 10 proceeds to the final step in the assembly process.

In the final step (not shown), the third integrated circuit die 16a is mounted at location 16 and is electrically connected to the electrical paths 18. Since the testing module 10 is now fully and completely assembled, the testing module 10 is tested. If there is a defect, the defect would arise only from the die 16 or the assembling thereof, and corrective action can be taken upon that die or that assembly step.

As can be seen from the foregoing, a single test program can be used to test the assembly of the plurality of integrated circuit dies 12a, 14a, and 16a during each step of the manufacturing process. Further, the method of the present invention can isolate the particular step in the manufacturing process where defects can occur and corrective action can be taken. From the foregoing, it can be appreciated that the method of the present invention can be used to test the module 10 with any number of locations for the assembling of integrated circuit dies. If there are N sites in the testing module 10, then N-1 complementary modules 110 must be made, pre-tested to be used in the method of the present invention.

Referring to FIG. 5 there is shown another embodiment of a supplementary module 210 useful in the method of the present invention. With the supplementary module 210, only a single complementary module 210 is required to test the testing module 10 irrespective of the number of locations 12, 14 . . . the module 10 has for the assembling of integrated circuit dies.

The supplementary module 210 shown in FIG. 5 comprises three integrated circuit dies 112a, 114a, and 116a mounted in the locations 112, 114, and 116. Again, although the discussion will be with reference to a module 210 with three locations, the description will apply to a module 210 with any number of locations. Electrical paths 118 interconnect the locations 112, 114, and 116. An integrated circuit die 112a is mounted on the module 210 at the location 112. Wire bonds electrically connect the integrated circuit die 112a to the electrical paths 118. However, a tri-state switch 120 is interposed in each one of the paths 118 which leads to the connections at the location 112. Each of the tri-state switches 120 can be activated by a signal sent along the path 130 to either connect the electrical paths 118 to the locations 112 and to the integrated circuit die 112a or to disconnect the integrated circuit die 112a from the electrical paths 118.

Similarly, integrated circuit die 114a is mounted at the location 114 and wire bonds electrically connect the integrated circuit die 114a to the electrical paths 118. A tri-state switch 122 is interposed in each one of the paths 118 leading to the location 114. All of the tri-state switches 122 can be activated by the signal on path 132 to either connect the integrated circuit die 114a to the electrical path 118 or to disconnect therefrom.

Finally, the integrated circuit die 116a is mounted at the location 116. A plurality of tri-state switches 124 can activate the electrical connection of the integrated circuit die 116a to the electrical paths 118 or to disconnect therefrom. Thus, with the supplementary module 210, a single supplementary module 210 can be used in each of the various steps described heretofore.

For example, to test the testing module 10 in the first step of the method of the present invention wherein the integrated circuit die 12a is mounted at the location 12 (as shown in FIG. 3), the tri-state switches 122 and 124 are set so that the electrical paths 118 are connected to the various integrated circuit dies 114a and 116a respectively. However, the tri-state switches 120 are set so that the integrated circuit die 112a is electrically disconnected from the electrical path 118. With this configuration, the supplementary module 210 can be used in the first step of the method of the present invention as shown in FIG. 3.

Similarly, the tri-state switches 120 and 122 can be set to disconnect the electrical connection from the electrical path 118 to the integrated circuit dies 112a and 114a. The tri-state switches 124 can be set to connect the electrical connection from the electrical paths 118 to the integrated circuit die 116a. In this configuration, the supplementary module 210 can be used in the second step of the method of the present invention as shown in FIG. 4.

Figure 6:
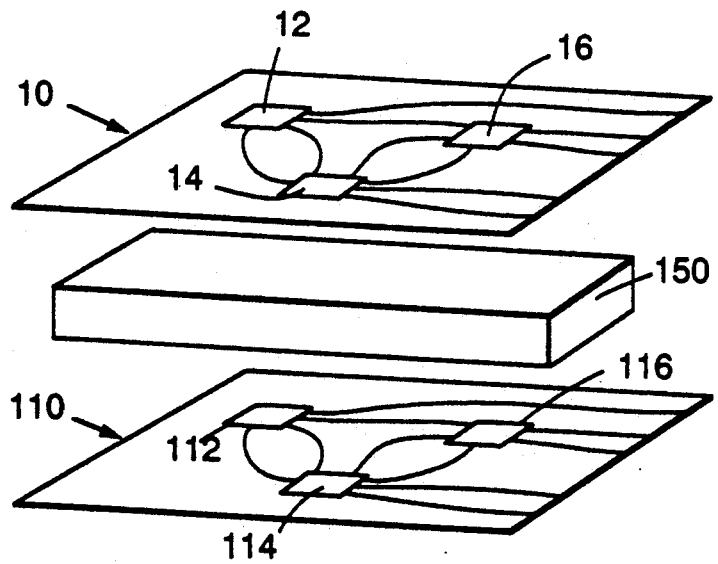
FIG. 6 is a perspective schematic view of one embodiment of the means to electrically interconnect the testing apparatus to the supplementary apparatus.

As previously described, the testing module 10 and supplementary module 110 must be electrically connected with the various locations being electrically connected to the various respective locations of the other to form a combined apparatus. Referring to FIG. 6 there is shown one method of connecting the locations 12, 14, and 16 of the testing module 10 to the respective locations 112, 114, and 116 of the supplementary module 110. The testing module 10 is placed substantially on top of the supplementary module 110 and a plurality of Zebra (tm) strips are placed in between the testing module 10 and supplementary module 110. The Zebra strips are a product of Teck-Nit, Inc. of Cranford, N.J. and form electrical interconnection paths from one end to the other. Such strips are well known. With the locations 12, 14, and 16 placed in alignment with the locations 112, 114, and 116 of the supplementary module 110, the Zebra strips 150 serve to form an electrically conductive path from the locations 12, 14 and 16 in the testing module 10 to the respective locations 112, 114 and 116 in the supplementary module 110.

Figure 7:
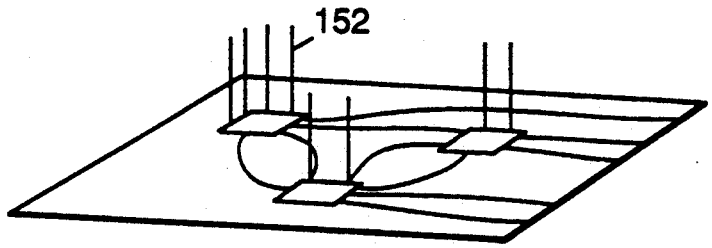
FIG. 7 is a perspective schematic view of another means for electrically interconnecting the testing apparatus to the supplementary apparatus.

Another method for interconnecting the locations in the testing module 10 to the locations in the supplementary module 110 is by the use of a bed of nails, shown in FIG. 7. The bed of nails comprise a plurality of spring loaded test pins 152 placed around each of the locations 112, 114, and 116. The bed of nails 152 then contact the respective locations 12, 14 and 16 in the testing module 10 and form the electrical interconnection thereto.

Other examples of interconnection between the testing module 10 and supplementary module 110 can include edge card connectors and plug and socket pin or mating headers—all of which are well known in the art.

As can be seen from the foregoing, the method and apparatus of the present invention offers a convenient and efficient method of isolating defects in the manufacturing step as each electrical component is assembled.

What is claimed is:

1. A method of testing a partially completely assembled electrical apparatus having one or more first locations, one or more second locations, and one or more electrical paths electrically connecting said first and second locations, with a first electrical component assembled in each of said first locations and electrically connected to said electrical paths and with a second electrical component to be assembled in each of said second locations and to be electrically connected to said electrical paths, said method comprising:

a) providing a supplementary electrical apparatus substantially identical to said apparatus being tested, said supplementary electrical apparatus having one or more first locations, one or more second locations, and one or more electrical paths electrically connecting said first and second locations, electrically identical to the electrical paths of the apparatus being tested, said supplementary electrical apparatus further comprising a second electrical component, electrically identical to the second electrical component to be assembled of said apparatus being tested, each of said second electrical component of said supplementary electrical apparatus being electrically connected to said electrical paths at each of said second locations;

b) electrically connecting the first and second locations of the apparatus being tested to the first and second locations, respectively, of the supplementary apparatus, to form a combined apparatus; and c) electrically testing said combined apparatus, as if it were a completely assembled and electrically connected electrical apparatus.

2. The method of claim 1 further comprising the step of:

d) assembling another first electrical component in said testing apparatus and electrically connecting it to the electrical paths at said first locations, and returning to step (a) in the event the test of step (c) is successful and discarding or repairing the testing apparatus in the event the test of step (c) is not successful.

3. A method of testing an electrical apparatus as it is being assembled, said apparatus having a plurality of locations for the assembly of electrical components thereon, and having one or more electrical paths interconnecting said locations, said method for testing said apparatus as one or more of said electrical components is assembled thereon to form a partially completely assembled apparatus, said method comprising the steps of:

a) assembling one electrical component on said electrical apparatus being tested (hereinafter "testing apparatus") to form a partially completely assembled test apparatus having one or more first locations with electrical components assembled thereon and electrically connected to the electrical paths, and one or more second locations for electrical components to be assembled thereon;

b) providing a supplementary electrical apparatus substantially identical to said testing apparatus, said supplementary electrical apparatus having one or more first locations, one or more second locations, and one or more electrical paths electrically connecting said first and second locations, electrically identical to the electrical paths of the apparatus being tested, said supplementary electrical apparatus further comprising electrical components, identical to the electrical components to be assembled of said apparatus being tested, electrically connected to said electrical paths at said second locations;

c) electrically connecting the first and second locations of the testing apparatus to the first and second locations, respectively, of the supplementary apparatus, to form a combined apparatus;

d) electrically testing said combined apparatus as if it were a completely assembled electrical apparatus; and e) returning to step (a) to assemble another electrical component in said testing apparatus in the event the test of step (d) is successful and discarding or repairing the testing apparatus in the event the test of step (d) is not successful.

4. An apparatus for testing a partially completely assembled electrical apparatus having one or more first locations, one or more second locations, and one or more electrical paths electrically connecting said first and second locations, with one or more first electrical components each assembled in each of said first locations and electrically connected to said electrical paths and with one or more second electrical components each to be assembled in each of said second locations and to be electrically connected to said electrical paths, said apparatus comprising:

a supplementary electrical apparatus substantially identical to said apparatus being tested, said supplementary electrical apparatus having one or more first locations, one or more second locations, and one or more electrical paths electrically connecting said first and second locations, electrically identical to the electrical paths of the apparatus being tested, said supplementary electrical apparatus further comprising one or more second electrical components, electrically identical to the electrical components to be assembled of said apparatus being tested, each electrically connected to said electrical paths at each of said second locations;

means for electrically connecting the first and second locations of the apparatus being tested to the first and second locations, respectively, of the supplementary apparatus; to form a combined apparatus; and means for electrically testing said combined apparatus, as if it were a completely assembled electrical apparatus.

5. The apparatus of claim 4 wherein the supplementary electrical apparatus further comprises:

switch means for electrically connecting and disconnecting said electrical components at said second locations to said electrical paths.

6. The apparatus of claim 5 wherein the supplementary electrical apparatus further comprises:

electrical components, electrically identical to the assembled electrical components of the apparatus being tested, assembled in said first locations; and switch means for electrically connecting and disconnecting said electrical components at said first locations to said electrical paths.

7. The apparatus of claim 4 wherein said electrical components are integrated circuits.

8. The apparatus of claim 4 wherein said electrical apparatus is a chip-on-board module.

9. The apparatus of claim 4 wherein said electrical apparatus is a printed circuit board.

* * * * *